United States Patent [19]
Paquin et al.

[11] Patent Number: 6,086,476
[45] Date of Patent: Jul. 11, 2000

[54] METHOD AND APPARATUS FOR COOLING AND ACOUSTIC NOISE REDUCTION IN A COMPUTER

[75] Inventors: David Paquin, Cypress; David Deis, Spring; Lowell Good, Cypress, all of Tex.

[73] Assignee: Compaq Computer Corporation, Houston, Tex.

[21] Appl. No.: 09/127,565

[22] Filed: Jul. 31, 1998

[51] Int. Cl.[7] .................................................. H05K 5/00
[52] U.S. Cl. ........................... 454/184; 181/225; 361/695
[58] Field of Search ................................... 454/184, 906; 361/678, 695; 181/224, 225

[56] References Cited

U.S. PATENT DOCUMENTS

| | | | |
|---|---|---|---|
| 5,422,787 | 6/1995 | Gourdine | 361/695 X |
| 5,460,441 | 10/1995 | Hastings et al. | 312/298 |
| 5,559,673 | 9/1996 | Gagnon et al. | 454/184 X |
| 5,566,377 | 10/1996 | Lee | 361/695 |
| 5,852,547 | 12/1998 | Kitlas et al. | 361/695 |

FOREIGN PATENT DOCUMENTS

| | | | |
|---|---|---|---|
| 2 581 930 | 11/1986 | France | 361/695 |
| 31 21 906 | 4/1982 | Germany | 361/695 |
| 34 01 210 | 7/1985 | Germany | 181/224 |
| 1198549 | 7/1970 | United Kingdom | 181/224 |

*Primary Examiner*—Harold Joyce
*Attorney, Agent, or Firm*—Akin, Gump, Strauss, Hauer & Feld, LLP

[57] ABSTRACT

A system for cooling a heat-producing component in a computer system includes a conduit or plenum and a fan assembly. The fan assembly may be supported by the conduit. An air stream directing and acoustic shielding member is disposed in the conduit to prevent or reduce transmission of acoustic noise during operation of the fan assembly to a region outside the computer console. The shield member may be made of an open-cell foam or other sound deadening or reflecting material. A secondary conduit is provided for recirculating a portion of the internal air within the computer chassis. The internal air stream may be joined and mixed with the air stream from outside the chassis to provide both fresh air and recirculation cooling.

25 Claims, 4 Drawing Sheets

METHOD AND APPARATUS FOR COOLING AND ACOUSTIC NOISE REDUCTION IN A COMPUTER

BACKGROUND OF THE INVENTION

1. Field of the Invention

The present invention relates generally to the field of cooling systems for computers housed within an enclosure or chassis. More particularly, the invention relates to a system for providing convective cooling of components within a computer chassis and for reducing transfer from the chassis of acoustical noise resulting from operation of the cooling system.

2. Description of the Related Art

A wide range of configurations are known and are commercially available for computer systems, including desktop computers, servers, work stations, and the like. In general, such systems include a primary console or cabinet supporting and housing various system components, including a signal processor, memory circuitry, hard disk drives, floppy drives, CD ROM drives, power supplies, and so forth. During operation of the computer system, significant heat may be generated by the components, particularly by the signal processing circuitry and drives. To avoid excessive temperatures which could cause damage to the system components, it is commonplace to provide fans for drawing a flow of air into and through the console chassis to convectively cool the components.

Conventional fan cooling systems for computers typically include a small DC motor directly coupled to a rotary fan. Depending upon the cooling requirements, several such fans may be included, such as for directing a flow of cooling air over signal processing circuitry, as well as through power supply circuitry. Inlet apertures are provided in the chassis to facilitate the circulation of air over the circuit components. The motor and fan sets are generally supported by either external mounting structures, or by plates which are secured directly to an interior peripheral wall of the chassis or to mounting tabs within the chassis. When the system is operating, the fan motor is energized by the power supply to force the desired air flow over the circuit components. Control elements may also be included, such as thermistors, for regulating the speed of the fan based upon sensed temperature.

While such conventional cooling techniques do provide adequate cooling in many situations, they are not without drawbacks. For example, the operation of cooling fans can generate significant levels of acoustical noise which may be transmitted to the operator through the apertures in the chassis provided for entry of cooling air. This is particularly true where fan assemblies are provided directly adjacent to an outer wall of the chassis, or in an external mounting structure. Moreover, noise due to turbulent flow of air into and through the chassis can result from operation of large cooling fans as may be required in more powerful systems. Also, conventional arrangements for cooling of the computer system components, such as CPUs, may not direct flow adequately over the circuitry, resulting in an unacceptable level of heating, particularly in warmer climates and higher altitudes.

In addition to the foregoing drawbacks, cooling systems for computer components often do not realize advantageous synergies between separate cooling structures within the systems. In particular, in addition to requiring cooling for signal processing circuitry and power supplies, many systems may require additional cooling for disk drives, floppy drives, CD drives, and so forth. Where such additional cooling is required, a supplementary cooling fan structure is generally provided. In certain known systems, this cooling fan assembly directs flow from an internal region of the chassis around the drives. However, the resulting flow rate of cooling air and the temperature difference across the drives may still remain insufficient for adequate cooling.

There is a need, therefore, for an improved technique for cooling components of computer systems housed within a system chassis. In particular, there is a need for an improved cooling system which reduces the amount of acoustical noise transmitted from the system chassis during operation of cooling fans and their drive motors. There is also a need for a cooling system capable of directing or orienting air flow to provide a more laminar stream and a direct path for cooling air both into and from cooling fans. Such a technique would advantageously afford additional cooling for system components such as drives.

SUMMARY OF THE INVENTION

The present invention provides a convective cooling approach designed to respond to these needs. The technique employed by the invention may be applied to a wide variety of system configurations, including desktop designs and tower arrangements and so forth. The technique provides acoustic shielding of noise or vibrations resulting from operation of a cooling fan and motor so as to limit the degree of such noise transmitted to the user through air inlet apertures in the chassis. The technique may both provide for absorption of such acoustical noise, as well for reflection of the noise in a direction away from the inlet apertures. The technique also affords enhanced direction of air flow both into a cooling fan as well as directly over system components such as CPUs. A cooling fan may be positioned within or adjacent to a plenum or other ductwork so as to direct convective air flow directly onto the cooled component. Additional conduit or ductwork may be provided for routing a portion of the cooling air flow over additional system components such as disk drives. The air flow over the disk drives may be supplemented by an auxiliary fan which forces air over the drives and into a primary cooling air stream created by a primary fan. The resulting system provides a cooling air circuit which draws fresh air from outside the chassis, circulates the air over system components and through the chassis to an outlet location. The outlet location may include further fan assemblies, such as for directing the air flow over or through a power supply circuit. Both the position and configuration of the cooling system provide significantly reduced acoustical noise transmissions to the system operator.

Thus, in accordance with one aspect of the invention, a system is providing for cooling a component in a computer chassis. The system includes a fan support, a fan assembly secured to the fan support, and an acoustic shield supported adjacent to the fan assembly. The fan assembly includes an electric motor and a fan, and is operative to produce a flow of air past the component for conductively cooling the component. The acoustic shield reduces transmission of acoustic noise from the fan assembly to an ambient region exterior of the chassis. The acoustic shield may include a variety of configurations, such as an open-cell foam member positioned between the fan assembly and air intake openings. The acoustic shield may also include air guiding surfaces which direct a flow of cooling air around the acoustic shield and into the fan assembly. Certain of the surfaces may also reflect acoustic noise in a direction away from the air intakes.

In accordance with another aspect of the invention, a system for cooling components in a computer chassis includes a first air conduit for directing a first stream of air from outside the chassis into the chassis. A second air conduit is in fluid communication with the first air conduit and directs a second air stream from within the chassis into a mixture of the first and second air streams. A fan assembly draws the first and second streams of air and directs the streams of air into the chassis for cooling the internal components. An air stream directing element may be positioned in one or both conduits to mix the air streams or to direct the air streams into the fan assembly. An acoustic shield may be included to prevent or reduce transmission of acoustic noise from the fan assembly to the outside of the chassis.

In accordance with yet another aspect of the invention, an acoustic shield is provided for a computer cooling system. The cooling system is of the type including a fan assembly disposed within an enclosure for drawing a stream of air through an air inlet for cooling a component disposed within the enclosure. The shield includes a shield body made of an acoustic energy absorbing material, and means for securing the shield body in a position between the fan assembly and the air inlet. The securing means may include various securement devices, such as an adhesive layer or adhesive tape. The acoustic shield may be made of an open-cell foam or other acoustic energy absorbing material, and may include surfaces for reflecting at least a portion of the acoustic noise in a direction away from the air inlet. While various configurations may be foreseen for the acoustic shield, it may be configured to facilitate manufacturing, such as by providing two orthogonal projections which may be formed by a conventional cutting operation, such as via water jets.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
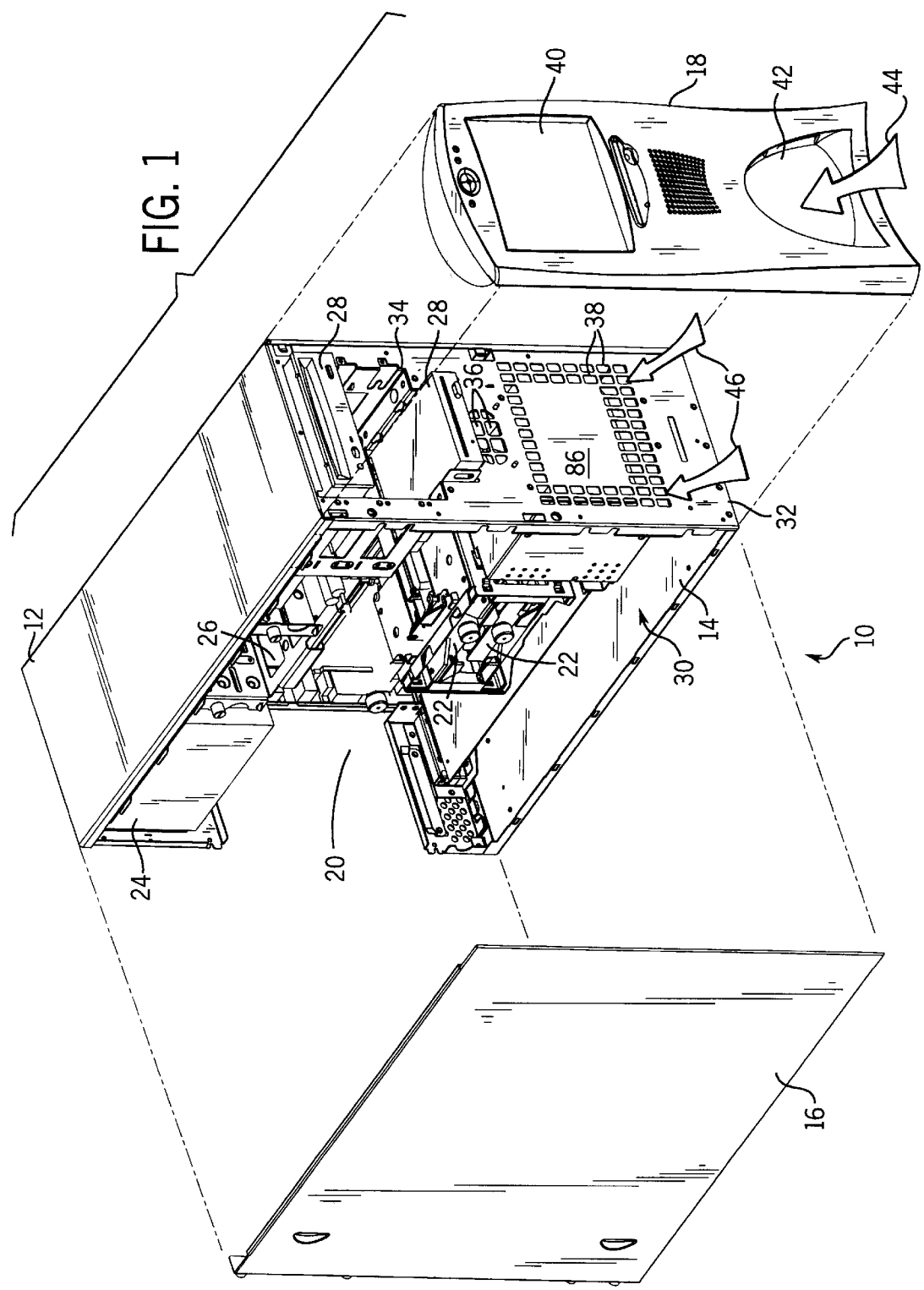
FIG. 1 is a perspective view of a console for a computer system in which front and side panels have been removed to show internal components and entrances for cooling air.

Turning now to the drawings, and referring first to FIG. 1, a computer system is illustrated and designated generally by the reference numeral 10. In the illustrated embodiment, computer system 10 comprises a console 12 which will typically include one or more central processing units, memory devices, input and output interface circuitry, and the like, as described more fully below. The illustrated embodiment console 12 takes the form of a tower-type console. However, as will be appreciated by those skilled in the art, various alternative configurations may be envisioned, including desk-top models, drawer arrangements (such as for use in stacked servers), portable models, as so forth. In a typical application, computer system 10 would be integrated with peripheral devices such as a monitor, a keyboard, a mouse, modem or other external communication connections, and so forth (not shown).

The console 12 shown in FIG. 1 includes components which have been removed for illustrative purposes. The basic mechanical structure of console 12 is a metallic chassis 14 which houses and supports the various components of the system. A side panel 16 is mounted on the chassis and is removable for access to the internal components of the system as shown in FIG. 1. Similarly, a front panel or bezel 18 is secured to a front area of chassis 14 to provide user access to drives, controls, and so forth, and to lend a aesthetically pleasing appearance to the system. When assembled, side panel 16 and other panels surrounding chassis 14 enclose an internal volume 20 in which the components of the system are positioned.

Certain of the internal components of system 10 may generate substantial amounts of heat during operation. Such components may include the CPU assemblies 22, as well as one or more power supplies 24. Moreover, system 10 may include various dynamic storage devices which also generate heat during operation. In the illustrated embodiment, internal disk drives are housed in disk drive bays 26. Other drives, such as disk drives, tape drives, CD ROM drives, and so forth, represented generally by the reference numeral 28, will also be supported within chassis 14 and will be accessible by the user from a position outside the chassis.

To provide cooling needed for proper operation of the internal components of system 10, a cooling system 30 is provided. The components and operations of cooling system 30 are described more fully below. In general, however, cooling system 30 draws air from outside of chassis 14 and circulates the air within the chassis to convectively cool the heat-generating components. In the illustrated embodiment, cooling system 30 is disposed adjacent a front side 32 of chassis 14. Openings 34 are formed in front side 32 for mounting various components, such as drives 28. Other openings 36 may be provided, such as to permit transmission of sounds from a speaker (not shown) disposed within the chassis. Finally, air inlet openings 38 are formed in front side 32 to permit air to be drawn into cooling system 30 as described below. Bezel 18 includes similar openings which are generally aligned with those of front side 32. Thus, in the illustrated embodiment, bezel 18 includes an access opening 40 through which drives 28 are accessible, and an air inlet 42 through which air may enter into inlet openings 38 of front side 32. Air inlet 42 may be covered by a perforated grill (not shown) or similar structure to permit such air flow, while providing an aesthetically pleasing appearance and preventing the ingress of larger objects into the system. Arrow 44 illustrates the ingress in cooling air through opening 42, while arrows 46 illustrate the progression of such air through inlet openings 38 in front side 32.

As will be appreciated by those skilled in the art, while the embodiment illustrated and described herein includes a cooling system which is disposed adjacent to a front panel of a console, the cooling and acoustic shielding techniques described herein may be adapted to various other configurations. Thus, air inlet openings may be provided in side or rear panels of a housing, and the cooling system disposed in locations other than adjacent to a front side or panel.

Figure 2:
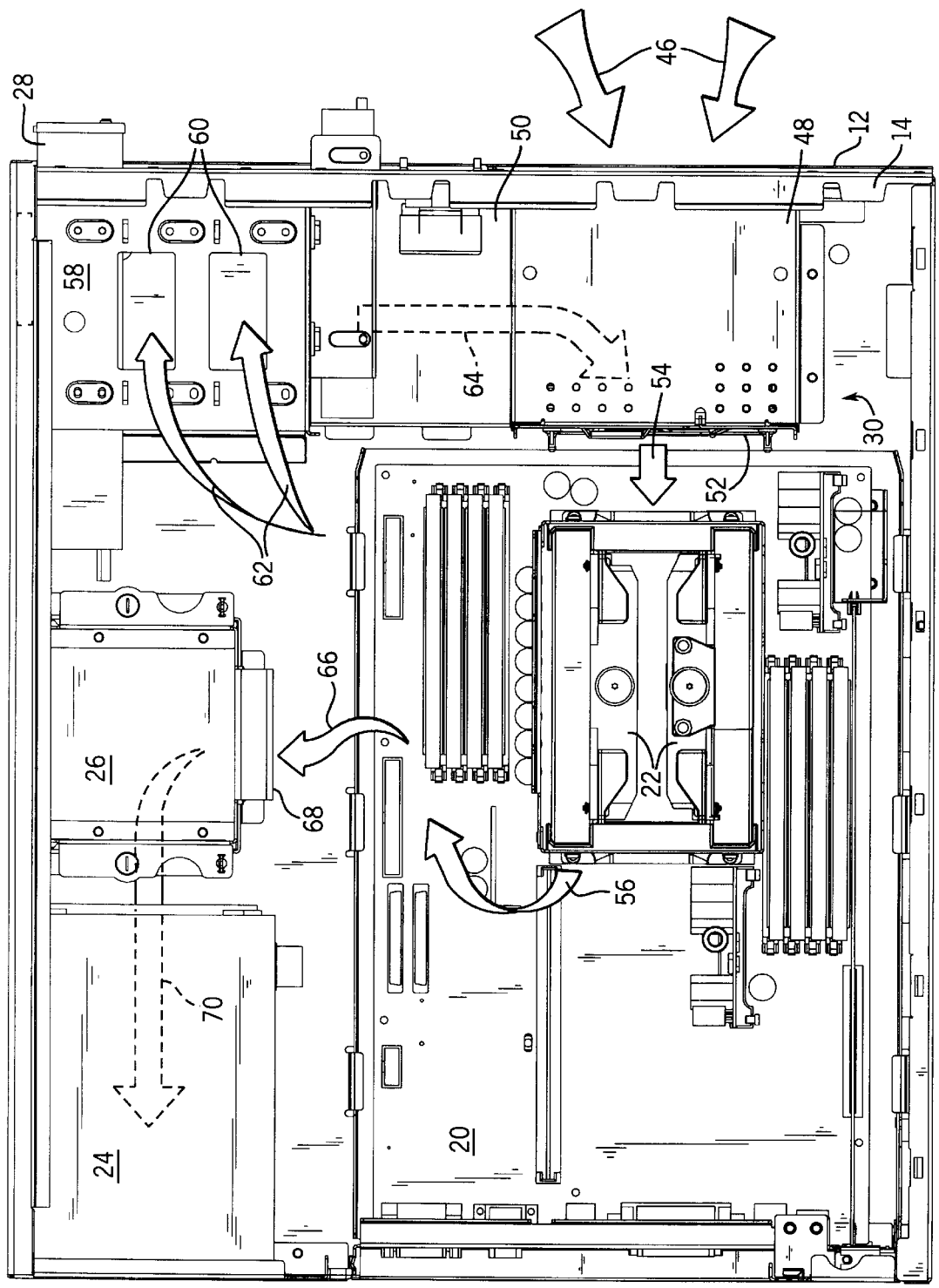
FIG. 2 is a side elevational view of the chassis and internal components of the system of FIG. 1, illustrating flow paths for cooling air in accordance with certain aspects of the present technique.
Figure 3:
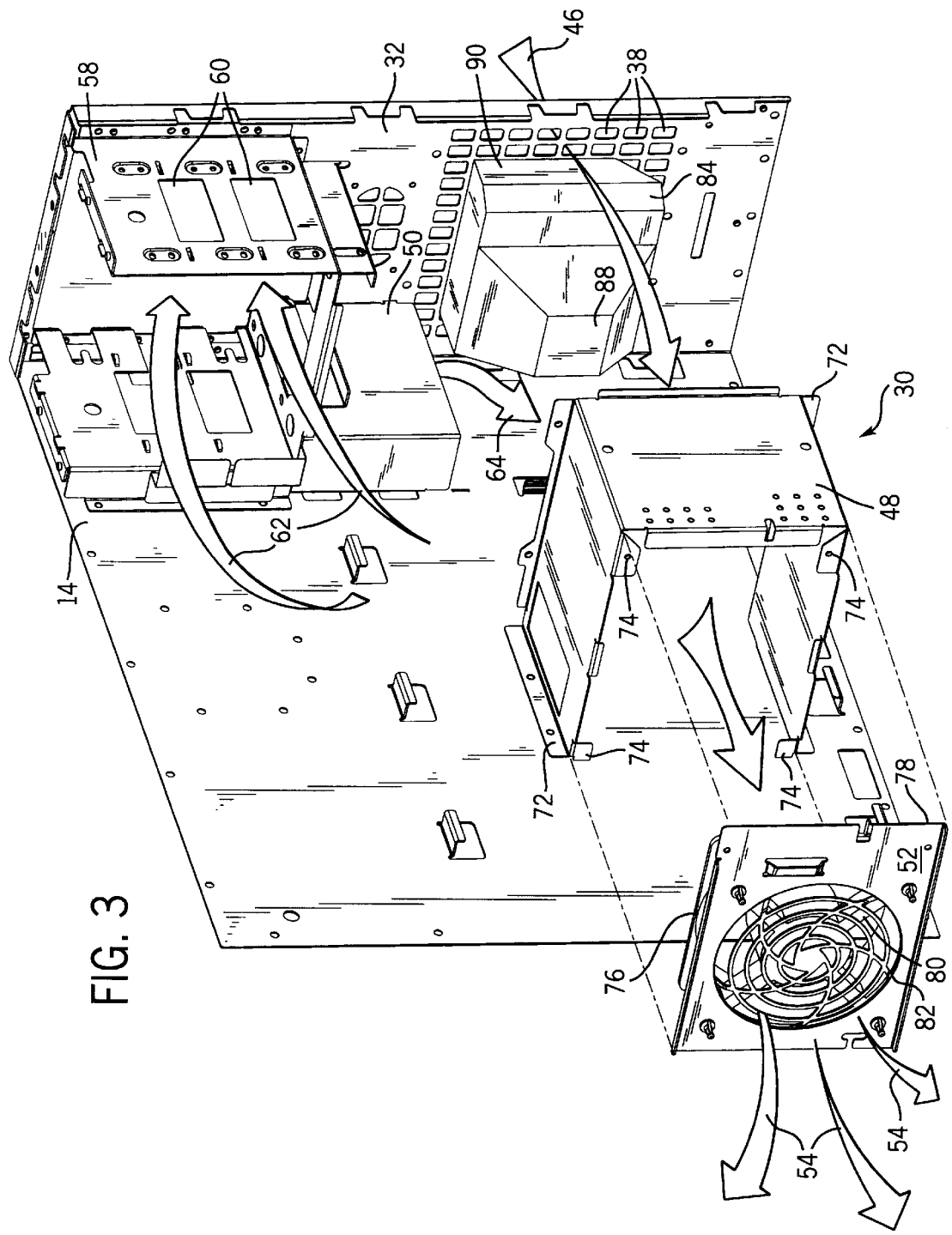
FIG. 3 is a perspective view of elements of a cooling system shown in FIG. 2 exploded to show a manner in which the cooling system may be configured.
Figure 4:
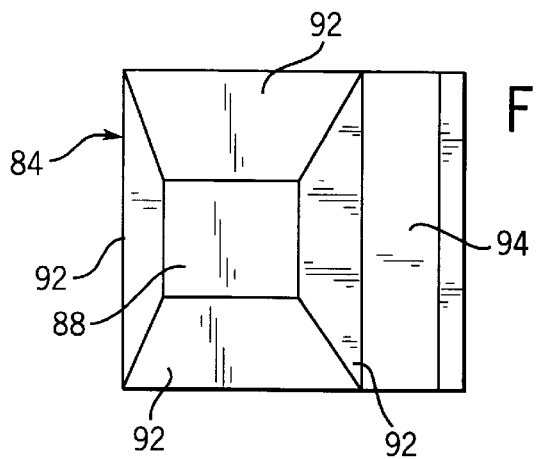
FIG. 4 is a rear elevational view of a cooling air directing and acoustic shielding element for use in the cooling system shown in FIG. 3.

FIGS. 2 and 3 illustrate an exemplary configuration of internal components of system 10 and an exemplary flow of cooling air around and through such components in accordance with certain aspects of the present technique. As shown in FIG. 2, cooling system 30 includes a plenum 48 through which the inlet air stream is drawn for cooling the system, as indicated by arrows 46. This air stream is directed over heat-producing components, such as CPU assemblies 22. As described below, acoustic noise produced by operation of the system is attenuated or prevented from exiting chassis 14 by an acoustic shielding system. While this acoustic shielding system may be provided for a fresh-air system alone, in the illustrated embodiment the cooling system also recirculates a portion of the air within chassis 14 through a conduit 50. Conduit 50 is in fluid communication with plenum 48 to direct an air stream including a portion of the air from internal volume 20 into plenum 48 for recirculation. Cooling system 30 further includes a fan assembly 52 for drawing air streams through plenum 48 and conduit 50. In the illustrated embodiment, fan assembly 52 is situated immediately adjacent to CPU assemblies 22 for directing cooling air directly over the CPU assemblies.

An exemplary flow of cooling air into and within chassis 14 is illustrated in FIG. 2. In this embodiment, inlet air streams 46 enter into plenum 48. Fan assembly 52 expels a cooling air stream 54 which passes through and around CPU assemblies 22, exiting into internal volume 20 of the system as illustrated by arrow 56. A drive support 58 for mechanically supporting drives 28 includes inlet openings 60 through which a portion of air stream 56 enters as indicated by arrows 62. This recirculated air stream serves to cool the drives within support 58, and produces a secondary air stream 64 which is communicated through conduit 50 into plenum 48. Thus, secondary air stream 64 is combined or mixed with incoming air 46 in plenum 48, permitting the cooling system to cool certain components by fresh external air, and other components by recirculated air within the chassis. An outlet air stream 66 is drawn from internal volume 20 and may be directed over certain additional heat generating components, such as internal disk drives held within an internal drive support 68. Finally, an output air stream 70 is directed from chassis 14, such as via a fan assembly (not shown) within power supply 24.

A presently preferred arrangement of the foregoing components of cooling system 30 is illustrated in an exploded view in FIG. 3. As shown in FIG. 3, plenum 48 may be formed of a single-piece of stamped and bent metal conduit designed to be secured directly to front and side panels of chassis 14. For this purpose, securement tabs 72 are formed around peripheral edges of plenum 48 for receiving securement fasteners (not shown). When secured to front side 32, plenum 48 preferably completely surrounds all air intake openings 38 to provide a maximum air flow through the openings and into fan assembly 52.

Plenum 48 may conveniently serve to support fan assembly 52 which, in turn, covers an open end of plenum 48 to efficiently draw air therethrough. Thus, in the illustrated embodiment, support tabs 74 are formed around plenum 48 for receiving fasteners (not shown) for securing fan assembly 52 in place over an open end of the plenum. Fan assembly 52 includes functional and support components, including a motor assembly 76, a support plate 78 to which the motor assembly is mounted, an impeller or fan 80, and an integral grill 82. In the illustrated embodiment, fan assembly 52 may be fabricated as a subassembly which is easily mounted to plenum 48 and wired to a power supply (not shown in FIG. 3) in a conventional manner.

Conduit 50 and drive support 58 are formed in a similar manner to plenum 48. Thus, each of these subassemblies may be formed of a stamped and bent blank of metal from which securement tabs protrude for receiving fasteners for attachment to chassis 14. Moreover, where recirculation of air from the internal volume of the system is not desired, conduit 50 may be omitted or covered, such as via a removable cap or plate (not shown). Similarly, one or more of the openings 60 in drive support 58, or similar openings around the drive support, may be covered via caps or plates. Similar techniques may be employed for preventing unwanted air flow through certain regions of either conduit 50 or component support 58. Moreover, a supplemental fan assembly (not shown) may be provided to force recirculating air into openings 60 in drive support 58, such as to ensure an adequate flow rate of cooling air therethrough.

In addition to providing both fresh air and recirculated air cooling, the illustrated technique offers reduced transmission of acoustic noise from the cooling system to a region outside of chassis 14. In conventional systems, operation of a cooling fan assembly may result in propagation of acoustic noise from the fan assembly through the incoming air stream to air inlet openings through which the air stream enters. The transmitted noise is particularly problematic where the computer system is operated in close environments or where inlet air openings are provided on a side of a chassis adjacent to an operator's work station.

The embodiment illustrated in FIG. 3 includes a member 84 which serves as an acoustic barrier for preventing or inhibiting acoustic noise from exiting chassis 14 during operation. Member 84 also serves as a guide for directing both fresh air stream 46 and recirculated air stream 64 through plenum 48 and directly into fan assembly 52. As shown in FIG. 3, member 84 is positioned within plenum 48 and extends from front side 32 of chassis 14 to a position closely proximate motor assembly 76 when fully assembled. While various configurations of acoustic barriers may be envisaged, member 84 is preferably a single-piece component which is secured directly to front side 32 in a blank central region 86 (see FIG. 1) surrounded by air inlet openings 38. Moreover, while member 84 may have various external configurations, in the illustrated embodiment a multi-faceted member is employed both for shielding acoustic noise and for directly the air streams into fan assembly 52. The member thus forms a reduced rear extension 88 which funnels air into the fan assembly, and an enlarged front portion 90 which aids in barring acoustic noise from being retransmitted from inlet openings 38.

A presently preferred configuration for barrier and guide member 84 is illustrated in FIGS. 4 through 8. As shown in those figures, member 84 includes a series of rear facets 92 which form angles directed away from the air inlet openings when the member is installed as shown in FIG. 3. Acoustic noise transmitted by fan assembly 52 contacts these surfaces and is reflected or redirected toward the interior of plenum 48 and, ultimately, the interior of chassis 14. A side extension 94 is formed in the illustrated embodiment due to the offset position of fan assembly 52 and plenum 48 within chassis 14. As will be apparent to those skilled in the art, depending upon the position and orientation of the various components within the chassis, such side extensions may be provided on one or more sides, or may be excluded from the design. A guide facet 98 is provided on a rear side of side extension 94 both to guide air toward the fan assembly, and to reflect acoustic noise from the fan assembly away from the air inlet openings. Finally, a bottom guide facet 96 is provided along a lower periphery of member 84 to enhance airflow through a double row of openings along a bottom edge (see FIG. 1). Bottom facet 96 thus enables larger quantities of fresh air to be directed into the chassis, while avoiding transmission of acoustic noise from the chassis, by virtue of the bottom position of the double row of air inlet openings.

Figure 8:
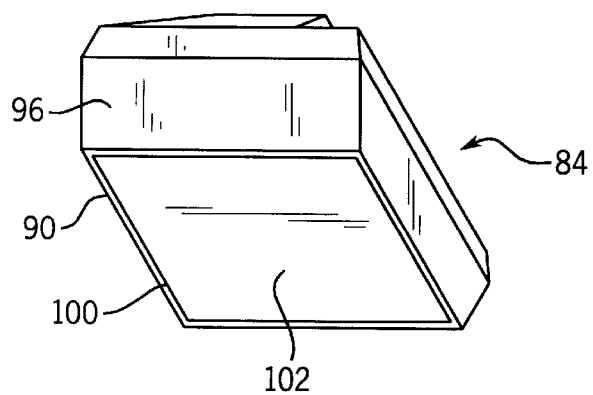
FIG. 8 is a bottom, front perspective view of the element of FIG. 4.

In a presently preferred embodiment, member 84 is made of an open-cell foam material which is extremely light weight and which absorbs and dissipates acoustic energy emanating from fan assembly 52. The use of a light weight material also facilitates fixation of member 84 within chassis 14. As best shown in FIG. 8, in the present embodiment, a flat front face 100 is formed on member 84 and an adhesive pad 102 is disposed on the front face prior to final assembly of the member in the chassis. With an adhesive surface of pad 102 exposed, member 84 is adhesively fixed to front side 32 of chassis 14 in central blank region 86 (see FIGS. 1 and 3). Alternatively, one or more such acoustic shields may be provided in a plenum or similar air conduit. Such multiple shields may define a circuitous path for incoming air flow and to direct the air flow toward the fan assembly. Similarly, other fixation devices may be foreseen, including brackets, supports, mechanical fasteners, and the like.

Figure 5:
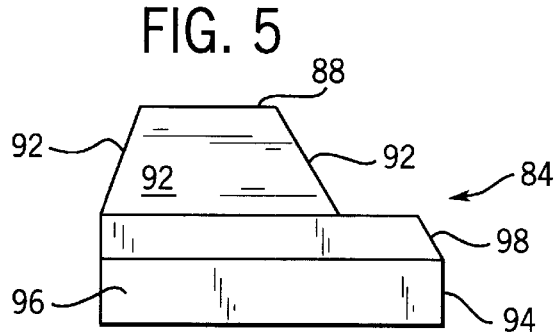
FIG. 5 is a top plan view of the element of FIG. 4.
Figure 6:
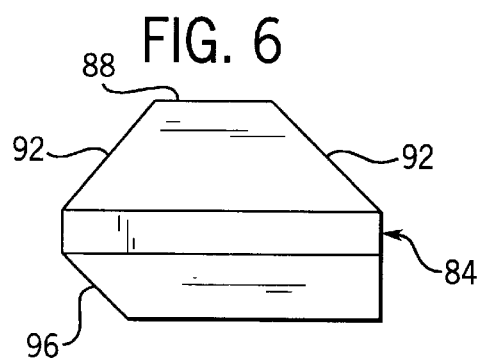
FIG. 6 is a right side view of the element of FIG. 4.
Figure 7:
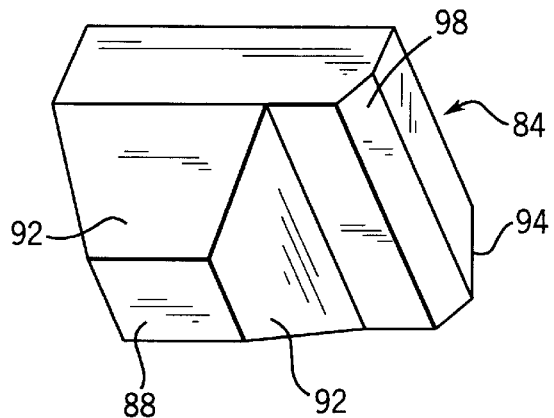
FIG. 7 is a top, rear perspective view of the element of FIG. 4.

In the embodiment illustrated, fabrication of member 84 is facilitated by the geometry defined by the faceted sides. In particular, as best shown in FIGS. 5 and 6, the member exhibits two distinct orthogonal projections as defined by the faceted sides. As will be appreciated by those skilled in the art, these projections facilitate certain manufacturing processes, such as carving or forming the member by linear translation through a cutting station, such as a water jet cutting station. Other manufacturing methods may, of course, be employed, including molding, extrusion, and so forth.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A system for cooling a component in a computer chassis, the system comprising:
    a plenum for conducting a stream of air from an air inlet in the chassis, the plenum having an open end;
    a fan assembly disposed adjacent to the open end of the plenum, the fan assembly including an electric motor and a fan, the fan assembly being operative to draw the stream of air through the plenum; and
    a flow directing member disposed in the plenum intermediate the air inlet and the fan assembly for directing the stream of air into the fan.

2. The system of claim 1, wherein the flow directing member is made of an acoustic dampening material for reducing noise transmission from the fan assembly to the air inlet.

3. The system of claim 1, wherein the flow directing member includes a plurality of flow directing surfaces angled toward the fan assembly, whereby the flow directing member channels air flow toward the fan assembly and reflects at least a portion of acoustic energy from the fan assembly in a direction away from the air inlet.

4. The system of claim 1, further comprising an air conduit in fluid communication with the plenum for drawing air from an internal volume of the computer chassis into the fan assembly.

5. The system of claim 4, wherein the air conduit extends between the plenum and a heat producing component within the chassis, whereby air from the internal volume of the computer chassis into the air conduit cools the heat producing component.

6. The system of claim 5, wherein the flow directing member includes a surface for directing air from the air conduit toward the fan assembly.

7. The system of claim 1, wherein the fan assembly is supported by the plenum.

8. A system for cooling components within a computer chassis, the system comprising:
    a first air conduit for directing a first stream of air from outside the chassis into the chassis;
    a second air conduit in fluid communication with the first air conduit for directing a second stream of air from within the chassis and mixing the second stream of air with the first stream of air; and
    a fan assembly in fluid communication with the first and second air conduits for drawing the first and second streams of air through the first and second air conduits and for directing air into the chassis to cool the components.

9. The system of claim 8, further comprising an air stream directing member disposed within the first conduit for directing the first and second air streams toward the fan assembly.

10. The system of claim 8, further comprising an acoustic shield disposed between the an air inlet and the fan assembly for reducing transmission of acoustic energy from the fan assembly to the air inlet.

11. The system of claim 10, wherein the acoustic shield includes air stream directing surfaces for channeling the and second air streams toward the fan assembly.

12. The system of claim 10, wherein the acoustic shield is made of an open cell foam material.

13. The system of claim 10, wherein the acoustic shield includes surfaces for reflecting at least a portion of the acoustic energy from the fan assembly in a direction away from the air inlet.

14. An acoustic barrier/guide for a computer system, the computer system including a chassis containing a fan assembly and an air inlet, the acoustic barrier/guide comprising:
    a first portion configured to direct acoustic noise from the fan assembly toward an interior of the chassis; and
    a second portion configured to guide air from the air inlet toward the fan assembly.

15. The acoustic barrier/guide of claim 14, further comprising:
    a third portion configured to bar acoustic noise from transmission through the air inlet toward an exterior of the chassis.

16. The acoustic barrier/guide of claim 15, wherein the third portion is an enlarged front portion.

17. The acoustic barrier/guide of claim 14, wherein the first portion comprises a plurality of rear facets.

18. The acoustic barrier/guide of claim 14, wherein the second portion comprises a reduced rear extension.

19. The acoustic barrier/guide of claim 14, wherein the second portion guides recirculated air to the fan assembly.

20. A computer system, comprising:

a chassis;

a fan assembly interior to the chassis;

an air inlet formed in the chassis; and an acoustic barrier/guide, comprising a first portion configured to direct acoustic noise from the fan assembly toward an interior of the chassis; and a second portion configured to guide air from the air inlet toward the fan assembly.

21. The acoustic barrier/guide of claim 20, further comprising:

a third portion configured to bar acoustic noise from transmission through the air inlet toward an exterior of the chassis.

22. The acoustic barrier/guide of claim 21, wherein the third portion is an enlarged front portion.

23. The acoustic barrier/guide of claim 20, wherein the first portion comprises a plurality of rear facets.

24. The acoustic barrier/guide of claim 20, wherein the second portion comprises a reduced rear extension.

25. The acoustic barrier/guide of claim 20, wherein the second portion guides recirculated air to the fan assembly.

* * * * *